United States Patent
Li et al.

(10) Patent No.: US 7,248,117 B1
(45) Date of Patent: Jul. 24, 2007

(54) FREQUENCY COMPENSATION ARCHITECTURE FOR STABLE HIGH FREQUENCY OPERATION

(75) Inventors: Ying Tian Li, Singapore (SG); Yayue Zhang, Singapore (SG)

(73) Assignee: Marvell International Ltd., Hamilton (BM)

( * ) Notice: Subject to any disclaimer, the term of this patent is extended or adjusted under 35 U.S.C. 154(b) by 118 days.

(21) Appl. No.: 11/171,026

(22) Filed: Jun. 30, 2005

Related U.S. Application Data

(60) Provisional application No. 60/650,320, filed on Feb. 4, 2005.

(51) Int. Cl.
  *H03F 3/45* (2006.01)
(52) U.S. Cl. .................... 330/260; 330/261
(58) Field of Classification Search ............... 330/260, 330/261, 257, 253, 255, 259
  See application file for complete search history.

(56) References Cited

U.S. PATENT DOCUMENTS 5,130,666 A * 7/1992 Nicollini .................. 330/253
6,847,260 B2 * 1/2005 Gupta et al. ............. 330/257
7,142,056 B2 * 11/2006 Blecker et al. ........... 330/253

OTHER PUBLICATIONS

Ahuja; an Improved Frequency Compensation Technique for CMOS Operational Amplifiers; IEEE Journal of Solid-State Circuits, vol. SC-18, No. 6, Dec. 1983; pp. 629-633.

* cited by examiner

*Primary Examiner*—Henry Choe

(57) ABSTRACT

An operational transconductance amplifier includes a first amplifier circuit that generates a first bias. A second amplifier circuit receives the first bias and generates a feedback signal. The first amplifier circuit also receives the feedback signal. A Miller compensation circuit receives the feedback signal and generates a second bias. An Ahuja compensation circuit receives the first and second biases and the feedback signal and generates a third bias. The second amplifier circuit receives the third bias. A feedback loop has an open loop response with first and second poles and a zero that are located below a crossover frequency. The Miller compensation circuit increases a frequency difference between the first and second poles. The Miller compensation circuit also adjusts a frequency of one of the poles so that the zero cancels an effect of the pole on the open loop response.

26 Claims, 15 Drawing Sheets

FREQUENCY COMPENSATION ARCHITECTURE FOR STABLE HIGH FREQUENCY OPERATION

CROSS-REFERENCE TO RELATED APPLICATIONS

This application claims the benefit of U.S. Provisional Application No. 60/650,320, filed on Feb. 4, 2005, which is hereby incorporated by reference in its entirety.

FIELD OF THE INVENTION

The present invention relates to frequency compensation circuits, and more particularly to frequency compensation circuits for operational transconductance amplifiers.

BACKGROUND OF THE INVENTION

The most relevant characteristics of an amplifier circuit are usually gain and bandwidth. In order to derive the bandwidth, an open loop response technique is used. The technique of looking at the open loop response provides information relating to the bandwidth and maximum achievable bandwidth of an amplifier circuit.

The DC gain of the open loop response is determined by opening the feedback loop and attaching a voltage source to an input side of the opened feedback loop. The output voltage is sensed at an output side of the opened feedback loop. To derive the bandwidth, the DC gain of the open loop response and the first dominant pole $P_1$ are found. Assuming stable operation, there is only one dominant pole $P_1$ located below the crossover frequency. The crossover frequency is the product of the DC gain of the open loop response and the first dominant pole $P_1$. The crossover frequency usually defines the bandwidth of the closed-loop amplifier. The maximum available bandwidth is related to the second non-dominant pole $P_2$.

Referring now to FIG. 1, an open loop response for an exemplary amplifier is shown. There is a constant gain from DC to a frequency of the first dominant pole $P_1$. At the frequency of the pole $P_1$, the gain begins falling. There is an inverse relationship between the gain and bandwidth of amplifiers. In general, higher gain values are associated with lower bandwidths, and lower gain values are associated with higher bandwidths.

Referring now to FIG. 2, it may be desirable to adjust the frequency of poles $P_1$ and $P_2$ for some applications. For example, it may be desirable for the amplifier to provide a relatively constant bandwidth at different gain values. In FIG. 2, the gain values are relatively constant from DC up to the frequency of the first dominant pole $P_1$. Because the first dominant pole $P_1$ is close to the second non-dominant pole $P_2$, the gain values fall off sharply upon reaching the first dominant pole $P_1$.

Various compensation techniques are known for adjusting the frequency of the poles of the amplifier. An operational amplifier (opamp) may be implemented using a two-stage amplifier. In two-stage amplifiers, Miller compensation or Ahuja compensation are sometimes used. Miller compensation employs a feedback capacitor connected across an input and output of the second amplifier stage. In Ahuja compensation, a current gain device is added in a feedback loop of the second amplifier stage.

Referring now to FIG. 3, it is sometimes difficult to adjust the frequencies of the poles $P_1$ and $P_2$ without creating stability problems. In FIG. 3, the phase response that is associated with the open loop response of FIG. 1 is shown. The phase response is 180 degrees from DC to about the frequency of the first pole $P_1$. At the frequency of the pole $P_1$, the phase response is approximately 90 degrees. The phase response remains at 90 degrees from the frequency of the first dominant pole $P_1$ until about the frequency of the second non-dominant pole $P_2$. At the frequency of the second non-dominant pole $P_2$, the phase response is approximately zero degrees.

The phase response in FIG. 3 also illustrates a phase margin of approximately 90 degrees. The phase margin is usually defined at unity gain. For acceptable stability, the phase margin should be greater than approximately 55–60 degrees. Otherwise, oscillation will occur. Therefore, the 90 degree phase margin that is shown in FIG. 3 is typically acceptable. However, moving the frequency of the second non-dominant pole $P_2$ closer to the zero crossing will reduce the phase margin. At some point, this will cause oscillation. Conversely, moving the first dominant pole $P_1$ to a lower frequency in FIG. 1 will increase the phase margin. At some point, this too will cause oscillation. For these reasons, it is generally not possible to adjust the frequencies of the poles $P_1$ and $P_2$ shown in FIG. 1 to produce the open loop response of FIG. 2 without creating stability problems.

In one approach, Miller compensation is used to move a dominant pole of a gain stage to a lower frequency by increasing the effective input capacitance of the gain stage. Miller compensation circuits include a Miller capacitor that exploits the Miller effect. When the Miller capacitor is connected across an input and an output of an amplifier, the capacitance appears much larger from the input of the amplifier. While the dominant pole may be moved to a lower frequency using this approach, bandwidth of the system is still limited.

Referring now to FIG. 4, a Miller compensation circuit 10 includes first and second amplifiers 12 and 14, respectively. A capacitor 16 (or compensating capacitance) communicates with an input and an output of the second amplifier 14. An input voltage 18, $V_{in}$, of the Miller compensation circuit 10 is applied to an input of the first amplifier 12, and an output voltage 20, $V_{out}$, is referenced from the output of the second amplifier 14. The transconductance, $g_{m_1}$, of the first amplifier 12 may be increased to increase the overall bandwidth.

Without the addition of the capacitor 16, the circuit 10 is unstable by nature. This is because the nodes at the input and output of the second amplifier 14 are both high impedance nodes. The poles that exist at the two high impedance nodes are close in frequency, which creates instability in the circuit 10. The object of Miller compensation is to split the two poles. By adding the capacitor 16, one of the poles is pushed to a higher frequency and another is pushed to a lower frequency.

This ensures a single dominant pole system and a stable circuit 10. For example, a phase margin of approximately 90 degrees is achievable using Miller compensation. However, at high frequencies, the capacitor 16 functions as a short-circuit. When this happens, the input and output of the second amplifier 14 are shorted, and the combination of the capacitor 16 and the second amplifier 14 creates a diode-connected transistor. In this case, any noise from a reference potential is transferred to the output of the second amplifier 14. Additionally, the power supply rejection ratio (PSRR) of the circuit 10 is low during high frequency operation. Therefore, if a good PSRR is required, the circuit 10 is insufficient for desirable operation.

During low frequency operations, a feedback loop exists. The feedback loop functions to correct disturbances between nodes and the output of the circuit 10. However, during high frequency operations, the loop gain drops. Eventually, the loop gain diminishes, and the feedback loop is no longer able to correct disturbances at the output of the circuit 10. The result is a low PSRR at high frequencies.

Referring now to FIG. 5, an Ahuja compensation circuit 60 is created by adding a current gain device 62 in the feedback path. The current gain device 62 communicates with the first end of the capacitor 16, the output of the first amplifier 12, and the input of the second amplifier 14. A transconductance, $g_{m_c}$, is associated with the current gain device 62.

During high frequency operation, the capacitor 16 still functions as a short-circuit. However, noise from the reference potential no longer directly couples to the output of the circuit 60. This is because the second amplifier 14 no longer becomes a diode-connected transistor at high frequencies. This makes it possible for the circuit 60 to achieve a good PSRR at high frequencies.

SUMMARY OF THE INVENTION

An operational transconductance amplifier (OTA) according to the present invention includes a first amplifier circuit that generates a first bias. A second amplifier circuit receives the first bias and generates a feedback signal. The first amplifier circuit also receives the feedback signal. A Miller compensation circuit receives the feedback signal and generates a second bias. An Ahuja compensation circuit receives the first and second biases and the feedback signal and generates a third bias. The second amplifier circuit receives the third bias.

In other features, the first amplifier includes a differential amplifier that includes first, second, third, and fourth transistors. A current source communicates with the first amplifier. The first, second, third, and fourth transistors are metal-oxide semiconductor field-effect transistors (MOSFETs). The Miller compensation circuit includes a capacitance that communicates with a resistance. The resistance receives the feedback signal. The capacitance generates the second bias. The resistance is one of a standard fixed-value resistor, a nonlinear resistor, and a metal-oxide semiconductor (MOS) resistor.

In still other features of the invention, the Ahuja compensation circuit includes a transistor that communicates with a capacitance and includes first and second current sources. The first current source communicates with a first terminal of the transistor and the second current source communicates with a second terminal of the transistor. The capacitance receives the feedback signal. The transistor receives the first and second biases. The transistor generates the third bias.

In yet other features, a feedback loop has an open loop response with first and second poles that are located below a crossover frequency. The Miller compensation circuit increases a frequency difference between the first and second poles. The feedback loop includes third and fourth poles and a second zero that are located above the crossover frequency. The open loop response further includes a zero that is located below the crossover frequency. The Miller compensation circuit adjusts a frequency of one of the poles so that the zero cancels an effect of the pole on the open loop response.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

Figure 1:
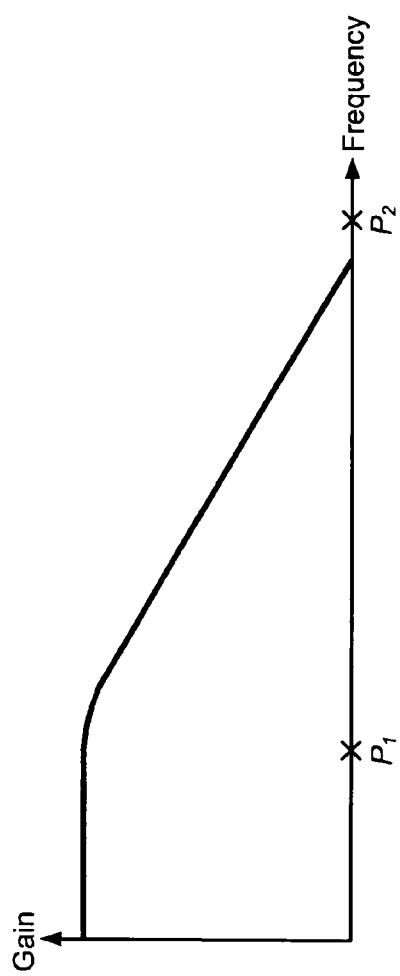
FIG. 1 is a graph illustrating an open loop response of an exemplary amplifier, according to the prior art.
Figure 2:
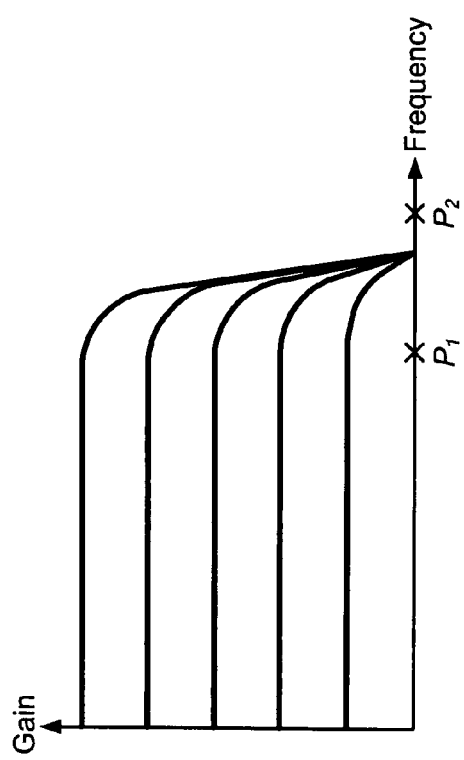
FIG. 2 is a graph illustrating a desired closed loop gain response for the exemplary amplifier, according to the prior art.
Figure 3:
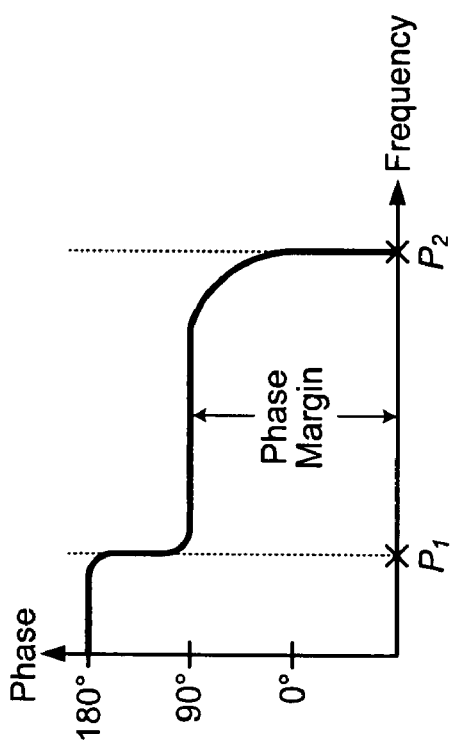
FIG. 3 is a graph illustrating the phase response corresponding to the open loop response of the exemplary amplifier, according to the prior art.
Figure 4:
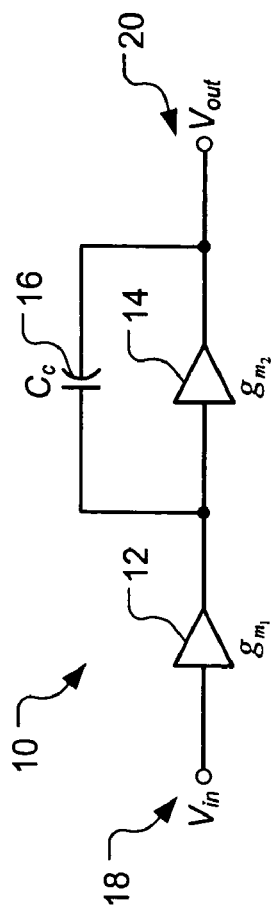
FIG. 4 is an electrical schematic of a Miller compensation circuit, according to the prior art.
Figure 5:
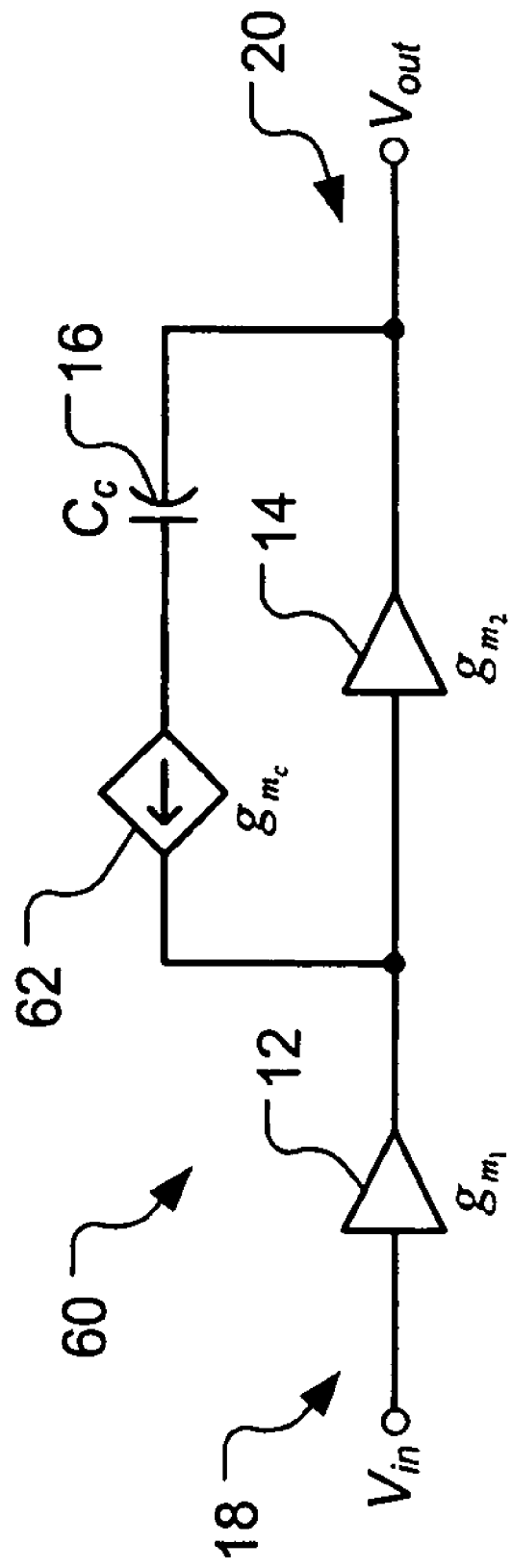
FIG. 5 is an electrical schematic of an Ahuja compensation circuit that includes a current gain device in the feedback path, according to the prior art.

The following description of the preferred embodiment(s) is merely exemplary in nature and is in no way intended to limit the invention, its application, or uses. For purposes of clarity, the same reference numbers will be used in the drawings to identify similar elements. As used herein, the term module refers to an application specific integrated circuit (ASIC), an electronic circuit, a processor (shared, dedicated, or group) and memory that execute one or more software or firmware programs, a combinational logic circuit, and/or other suitable components that provide the described functionality.

The most commonly used and well-known frequency compensation method for two-stage operational amplifiers (op-amps) is Miller Compensation. However, Miller Compensation circuits have a poor AC power supply rejection (PSRR) to the power rails. In 1983, Bhupendra K. Ahuja invented an improved frequency compensation technique called Ahuja compensation. By using this compensation method, the PSRR performance is improved to widen the bandwidth of op-amps.

However, Ahuja Compensation circuits include three feedback loops as opposed to a single feedback loop associated with traditional frequency compensation circuits. According to the present invention, the three feedback loops are identified as the Main Loop, the Internal Loop, and the Combined Loop. The Combined Loop is the sum of Main Loop and Internal Loop. Due to the high bandwidth of the Combined Loop, the PSRR is improved over a much higher bandwidth as compared to Miller Compensation. However, the Combined Loop is unstable due to a high unity-gain bandwidth. The present invention discloses a new frequency compensation architecture that improves stability and maintains a desirable PSRR performance. Additionally, the Combined Loop is independently analyzed to ensure stability.

Figure 6:
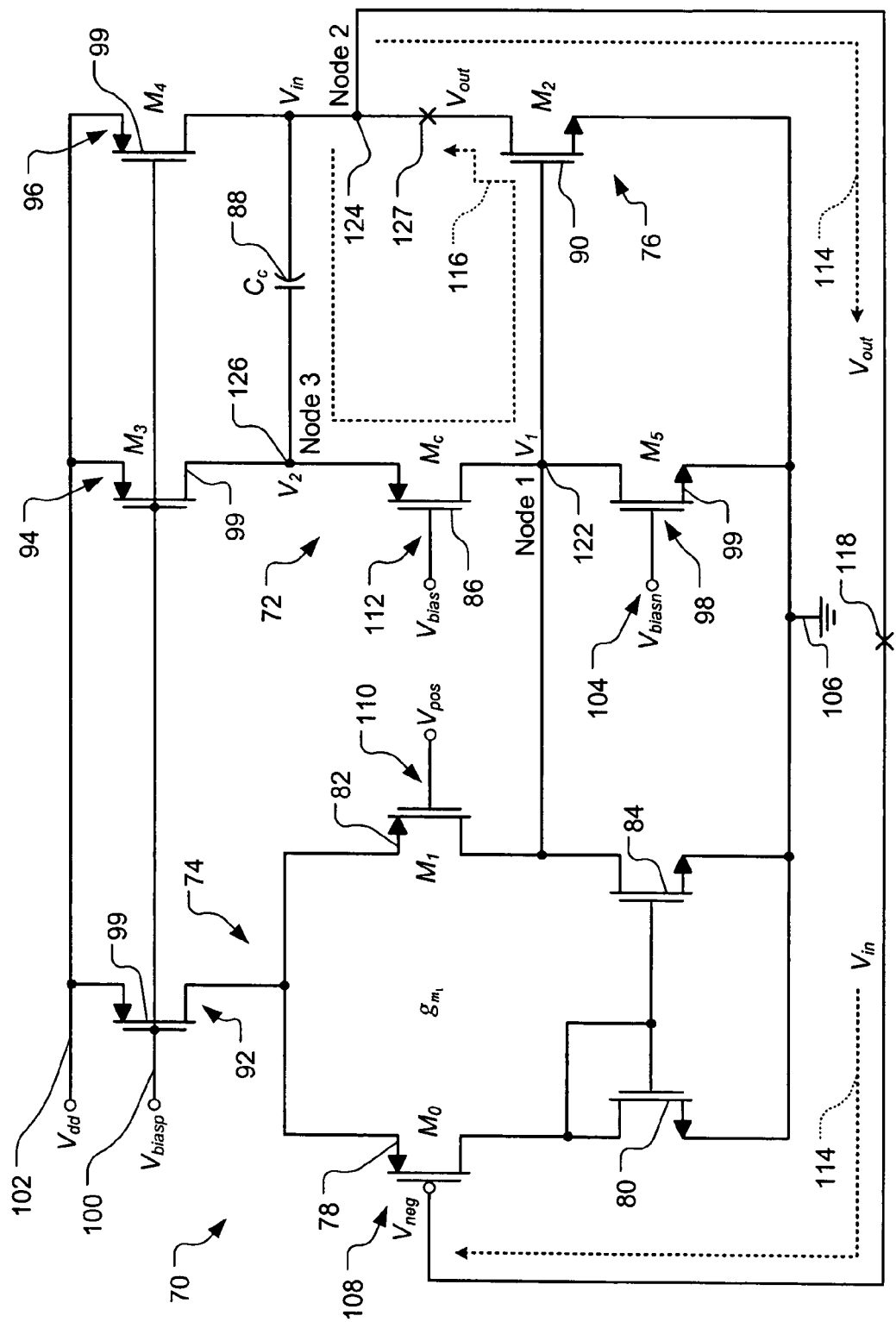
FIG. 6 is an electrical schematic of a 2-stage OTA that includes an Ahuja compensation architecture including a main loop and an internal loop, according to the present invention.

Referring now to FIG. 6, an exemplary 2-stage operational transconductance amplifier (OTA) 70 includes an Ahuja frequency compensation architecture 72. The OTA 70 also includes first and second amplifier stages 74 and 76, respectively. The first amplifier stage 74 can be a differential amplifier that includes first, second, third, and fourth transistors 78, 80, 82, and 84, respectively. For example, the first, second, third, and fourth transistors 78, 80, 82, and 84, respectively, may be metal-oxide semiconductor field-effect transistors (MOSFETs) that have gates, sources, and drains, although other transistor types may be used. Sources (or first terminals) of the first and third transistors 78 and 82, respectively, communicate. Drains (or second terminals) of the first and third transistors 78 and 82 communicate with drains of the second and fourth transistors 80 and 84, respectively. Gates (or control terminals) of the second and fourth transistors 80 and 84, respectively, communicate. The drain of the second transistor 80 communicates with the gate of the second transistor 80.

The Ahuja compensation architecture 72 includes a fifth transistor 86 and a first capacitor 88. A drain of the fifth transistor 86 communicates with the drains of the third and fourth transistors 82 and 84, respectively. A source of the fifth transistor 86 communicates with a first end of the first capacitor 88. The second amplifier stage 76 includes a sixth transistor 90. A gate of the sixth transistor 90 communicates with the drain of the fifth transistor 86. A drain of the sixth transistor 90 communicates with a second end of the first capacitor 88 and a gate of the first transistor 78.

The sources of the first and third transistors 78 and 82, respectively, communicate with a first end of a first current source 92. The source of the fifth transistor 86 and the first end of the first capacitor 88 communicate with a first end of a second current source 94. The second end of the first capacitor 88 and the drain of the sixth transistor 90 communicate with a first end of a third current source 96. The drains of the third, fourth, and fifth transistors 82, 84, and 86, respectively, and the gate of the sixth transistor 90 communicate with a first end of a fourth current source 98. In FIG. 6, the first, second, and third current sources 92, 94, and 96, respectively, include transistors 99 with gates that receive a positive bias voltage 100. However, other current source arrangements are contemplated. Additionally, the sources of the transistors 92, 94, and 96 communicate with a supply potential 102.

In FIG. 6, the fourth current source 98 includes a transistor 99 with a gate that receives a negative bias voltage 104. The fourth current source 98 communicates with a reference potential 106. Additionally, sources of the second, fourth, and sixth transistors 80, 84, and 90, respectively, communicate with the reference potential 106 such as ground. The gate of the first transistor 78 receives a negative voltage 108, and a gate of the third transistor 82 receives a positive voltage 110. Additionally, a gate of the fifth transistor 86 receives a bias voltage 112.

The Ahuja compensation architecture 72 includes a Main Loop 114 and an Internal Loop 116. In order to analyze the Main Loop 114, a break 118 is made in the Main Loop 114 as indicated in FIG. 6. The DC gain of the open loop response is determined by opening the feedback loop and attaching a voltage source to an input side of the opened feedback loop. The output voltage is sensed at an output side of the opened feedback loop. To derive the bandwidth, the DC gain of the open loop response and the first dominant pole $P_1$ are found. Assuming stable operation, there is only one dominant pole $P_1$ located below the crossover frequency. The crossover frequency is the product of the DC gain of the open loop response and the first dominant pole $P_1$. The crossover frequency usually defines the bandwidth of the closed-loop amplifier. The maximum available bandwidth is related to the second non-dominant pole $P_2$.

Figure 7:
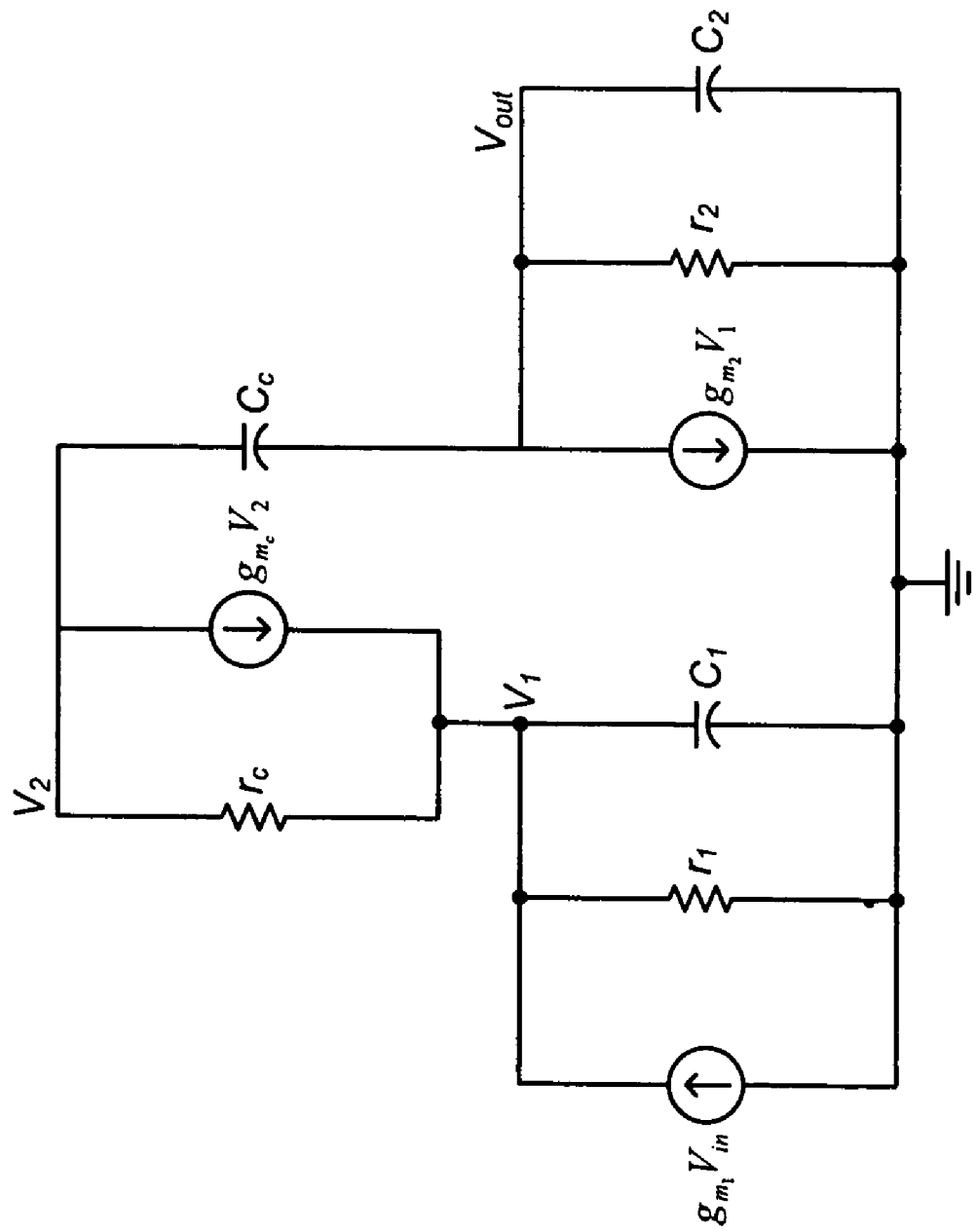
FIG. 7 is an equivalent circuit of the main loop of the OTA in FIG. 6 including an open loop response.

Referring now to FIG. 7, the equivalent circuit for the Main Loop 114 is shown. Kirchhoff's voltage law (KVL) and Kirchhoff's current law (KCL) are used to generate node equations. Based on the equivalent circuit, the first node equation is $$\frac{V_2 - V_1}{r_c} = V_1 C_1 S + \frac{V_1}{r_1}.$$

The second node equation is $$(V_{out} - V_2)C_c S + \frac{V_{out}}{r_2} + V_{out} C_2 S = 0.$$

The third node equation is $$(V_{out} - V_2)C_c S = V_2 g_{m_c} + \frac{V_2 - V_1}{r_c},$$

where $r_1$ is the impedance at a first node 122 shown in FIG. 6, $C_1$ is the capacitance at the first node 122, $r_2$ is the impedance at a second node 124 shown in FIG. 6, $C_2$ is the capacitance at the second node 124, $r_3$ is the output impedance of the second current source 94 (identified as p-channel MOS (PMOS) transistor M3 in FIG. 6), $C_3$ is the capacitance at a third node 126 shown in FIG. 6, $r_c$ is the channel resistance of the fifth transistor 86 (identified as PMOS transistor $M_c$ in FIG. 6), and $g_{m_c}$ is the transconductance of the fifth transistor 86.

Based on the three node equations, the transfer function for the Main Loop 114 is determined. The transfer function is $$\frac{V_{in}}{V_{out}}(S) = -(g_{m_1}r_1)(g_{m_2}r_2)\frac{\frac{C_c}{g_{m_c}}S+1}{\frac{1}{g_{m_c}}r_1r_2C_1C_2C_cS^3 + (r_1r_2C_1C_c + r_1r_2C_1C_2)S^2 + g_{m_2}r_1r_2C_cS + 1}.$$

Based on the transfer function, there are three poles and a single zero. The first pole is $$w_{P1} = \frac{1}{(g_{m_2}r_2)(r_1c_c)}.$$

The second pole is $$w_{P2} = -\frac{g_{m_2}r_1r_2C_c}{r_1r_2C_1(C_cC_2)} = -\frac{g_{m_2}}{C_c+C_2} * \frac{C_c}{C_1}.$$

The third pole is $$w_{P3} = \frac{r_1r_2C_1(C_c+C_2)}{\frac{1}{g_{m_c}}r_1r_2C_1C_2C_c} = -\frac{g_{m_c}}{\frac{C_2C_c}{C_c+C_c}}.$$

The zero is $$w_{z1} = -\frac{g_{m_c}}{C_c}.$$

Figure 8:
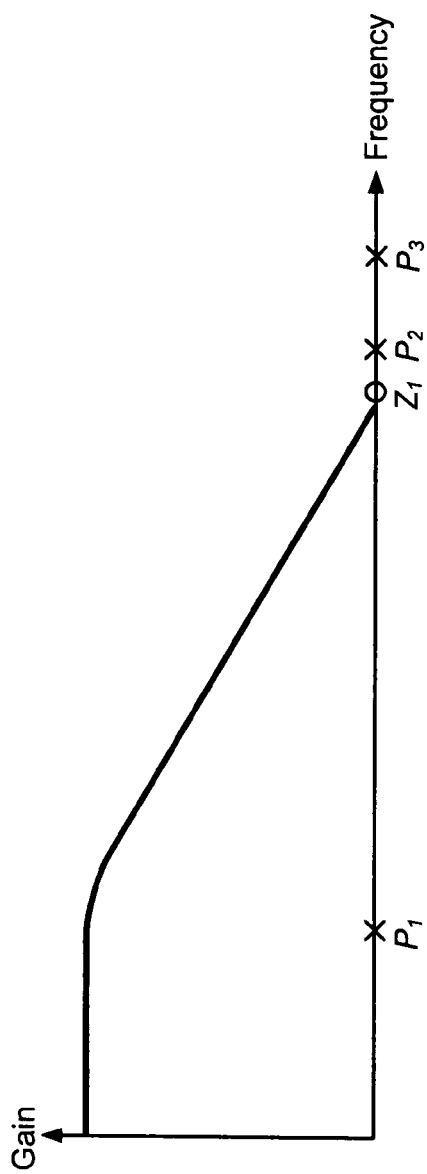
FIG. 8 illustrates the open loop response of the main loop of the OTA in FIG. 6.
Figure 9:
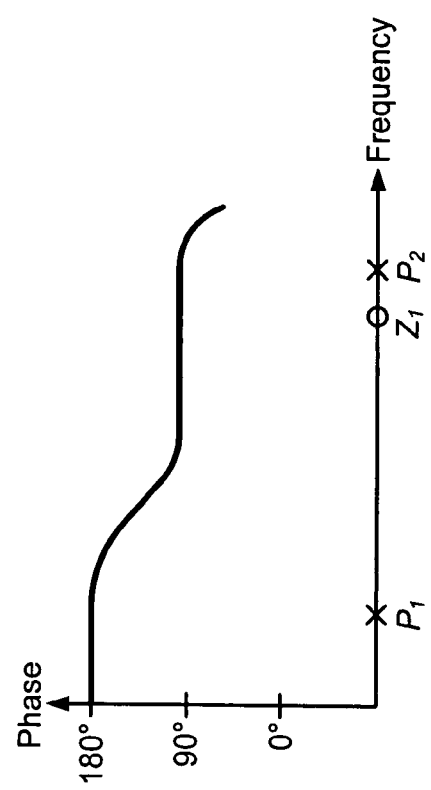
FIG. 9 is a graph illustrating the phase response corresponding to the open loop response of the main loop of the OTA in FIG. 6.

Referring now to FIGS. 8 and 9, the unity gain bandwidth (UGB) is $$\frac{g_{m_c}}{C_c},$$

which is the same as with Miller compensation. The first pole $P_1$ also exhibits the Miller effect and is the same as with Miller compensation. The main difference from Miller compensation is that the two non-dominant poles $P_2$ and $P_3$ are different. However, all of the non-dominant poles are pushed to much higher frequencies. Additionally, the zero $Z_1$ is located at a high frequency. Therefore, with respect to the Main Loop 114 the circuit 70 is stable.

Figure 10:
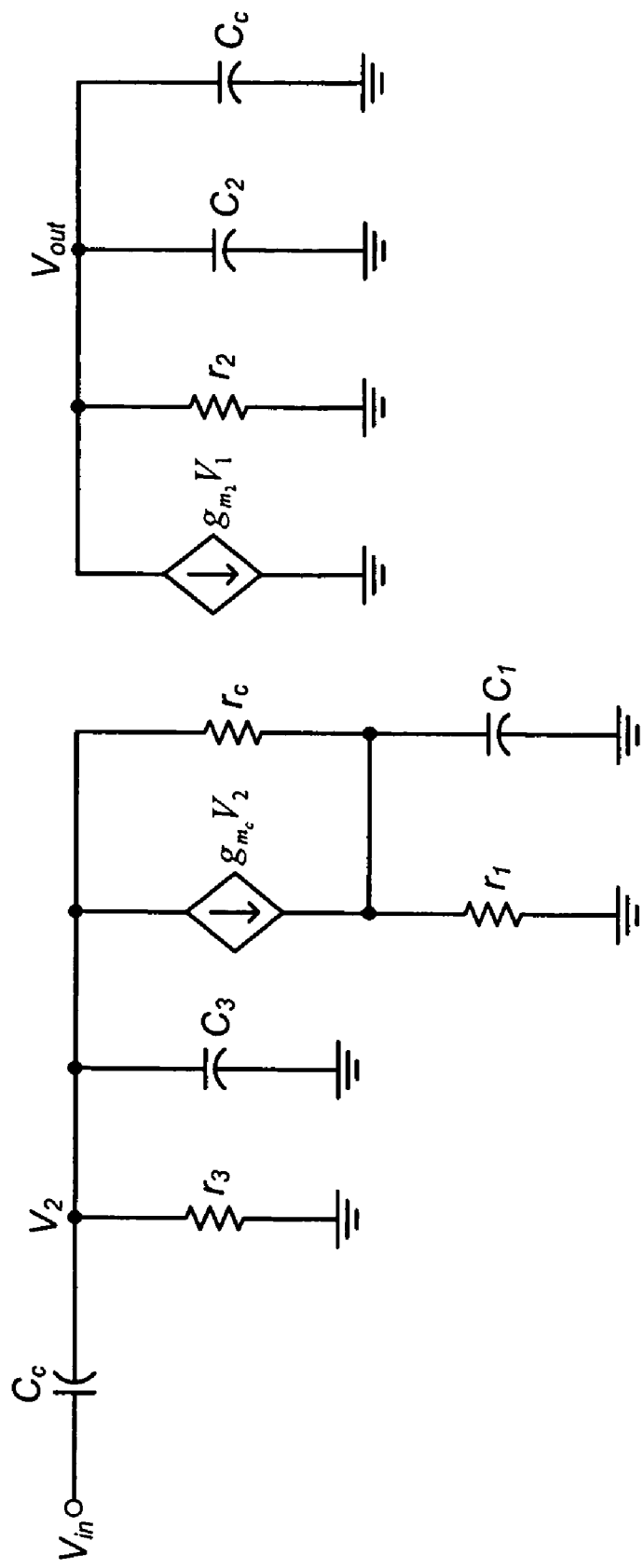
FIG. 10 is an equivalent circuit of the internal loop of the OTA in FIG. 6 including an open loop response.

Referring now to FIG. 10, in order to analyze the Internal Loop 116, a break 127 as shown in FIG. 6 is made in the Internal Loop 116. The Internal Loop 116 is formed between the second amplifier stage 76 and the Ahuja compensation architecture 72. The Internal Loop 116 includes an additional transconductance $g_{m_c}$ that corresponds with the fifth transistor 86. FIG. 10 shows the equivalent circuit for the Internal Loop 116. As with FIG. 7, KVL and KCL are used to generate the node equations.

Based on the equivalent circuit, the first node equation is $$(V_{in} - V_2)SC_c = \frac{V_2}{r_3} + V_2SC_3 + g_{m_c}V_2 + \frac{V_2 - V_1}{r_c}.$$

The second node equation is $$g_{m_c}V_2 + \frac{V_2 - V_1}{r_c} = \frac{V_1}{r_1} + V_1SC_1.$$

The third node equation is $$g_{m_2}V_1 + \frac{V_{out}}{r_2} + V_{out}S(C_2 + C_c) = 0.$$

Based on the node equations, the transfer function for the Internal Loop 116 is determined. The transfer function is $$\frac{V_{out}}{V_{in}} = \frac{(-g_{m_2}r_1r_2C_cS)}{\frac{1}{g_{m_c}}r_1r_2C_1C_2C_cS^3 + \left(\frac{r_1r_2}{g_{m_c}r_c}C_2C_c + \frac{r_2}{g_{m_c}}C_2C_c + r_1r_2C_1(C_2+C_c)\right)S^2 + r_2(C_2+C_c)S + 1}.$$

Based on the transfer function, there are three poles and a single zero. The first pole is $$w_{P1} = -\frac{1}{r_1C_1}.$$

The second pole is $$w_{P2} = -\frac{1}{r_2(C_2+C_c)}.$$

The third pole is $$w_{P3} = -\frac{1}{\frac{1}{g_{m_c}} * \frac{C_2C_c}{C_2+C_c}}.$$

The zero is $w_z=0$.

Therefore, the zero $Z_0$ is at zero frequency. Pole $P_1$ is located at the first node 122, which is a high impedance node. Pole $P_2$ is located at the second node 124 and is also a high impedance node. The term $(C_2+C_c)$ is the capacitance at the second node 124, which is the parallel combination of Cc and the output parasitic capacitance at the second node 124. Pole $P_3$ is located at the third node 126, which is a low impedance node.

Figure 11:
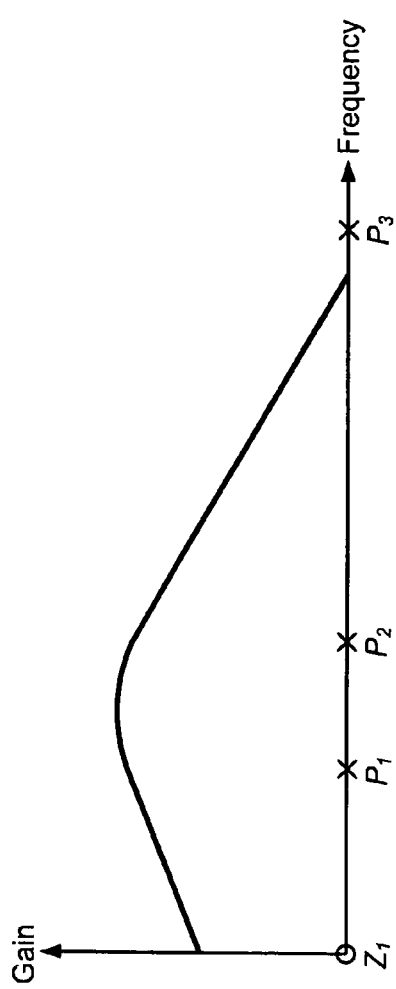
FIG. 11 illustrates the open loop response of the internal loop of the OTA in FIG. 6.
Figure 12:
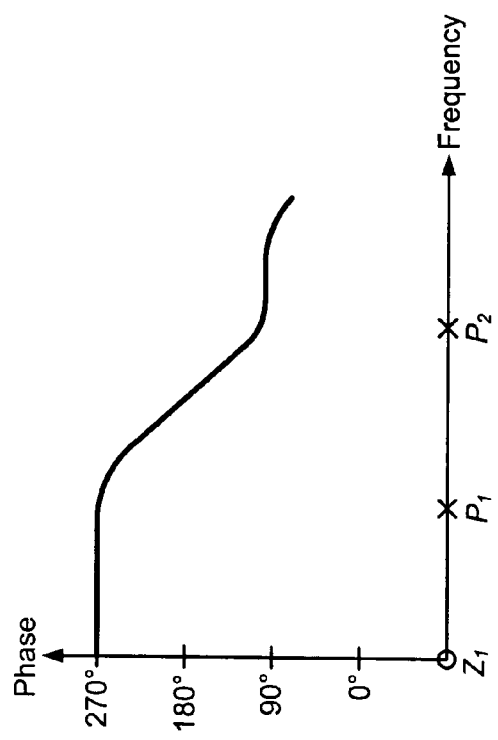
FIG. 12 is a graph illustrating the phase response corresponding to the open loop response of the internal loop of the OTA in FIG. 6.

Referring now to FIGS. 11 and 12, because poles $P_1$ and $P_2$ are both high impedance nodes, the two poles are located at low frequencies and are close to each other. Since the impedance at the third node 126 is low, pole $P_3$ is a high frequency pole. The existence of the zero at a frequency of zero contributes to the stability of the Internal Loop 116. The phase drops and eventually levels at 90 degrees to exhibit a phase margin equal to approximately 90 degrees. According to the simulation results, the phase margin is around 90 degrees. The plots of the gain and phase verify the stability of the Internal Loop 116.

Figure 13:
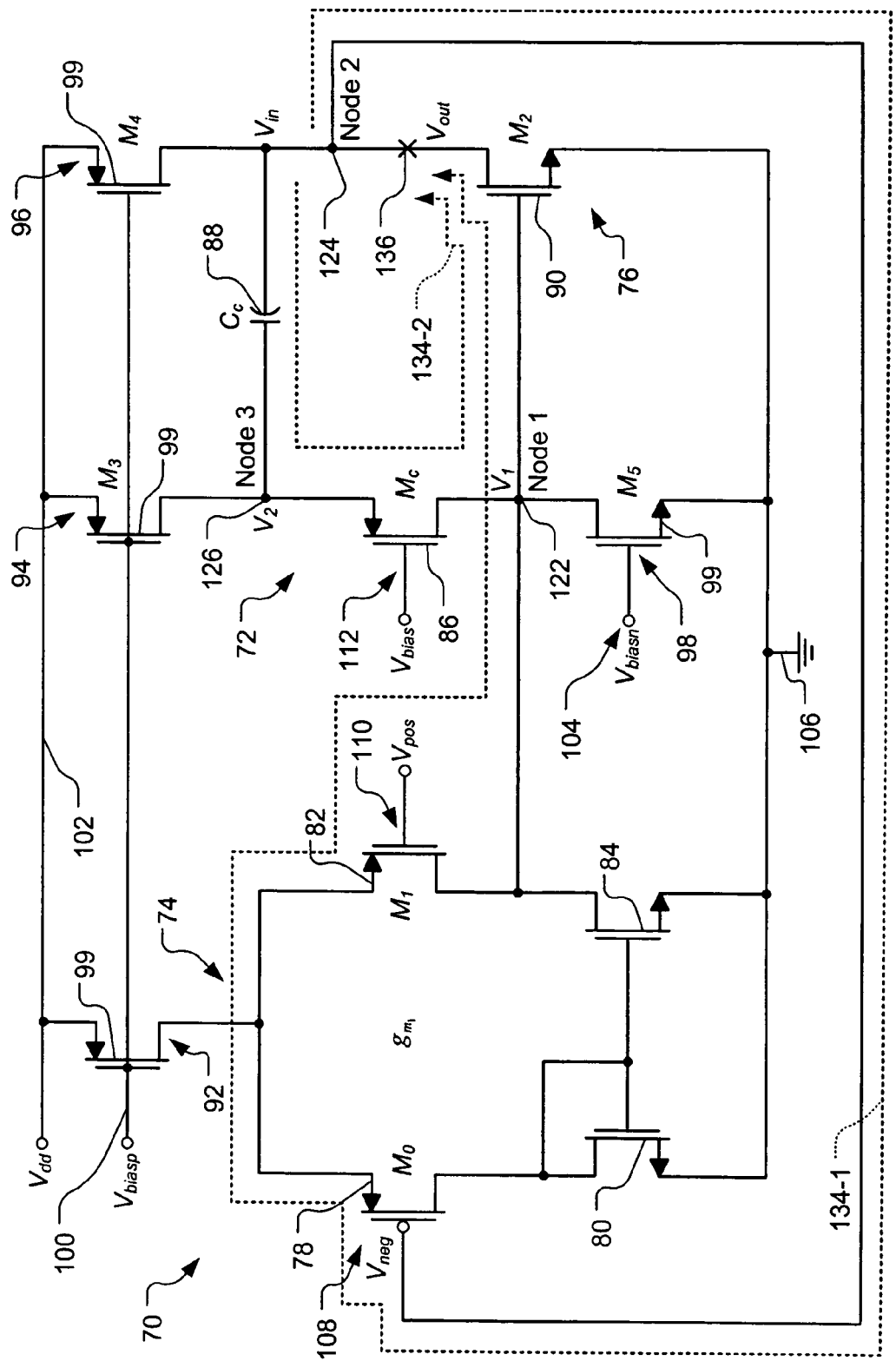
FIG. 13 is an electrical schematic of the Ahuja compensation architecture including a combined loop that comprises the main and internal loops.
Figure 14:
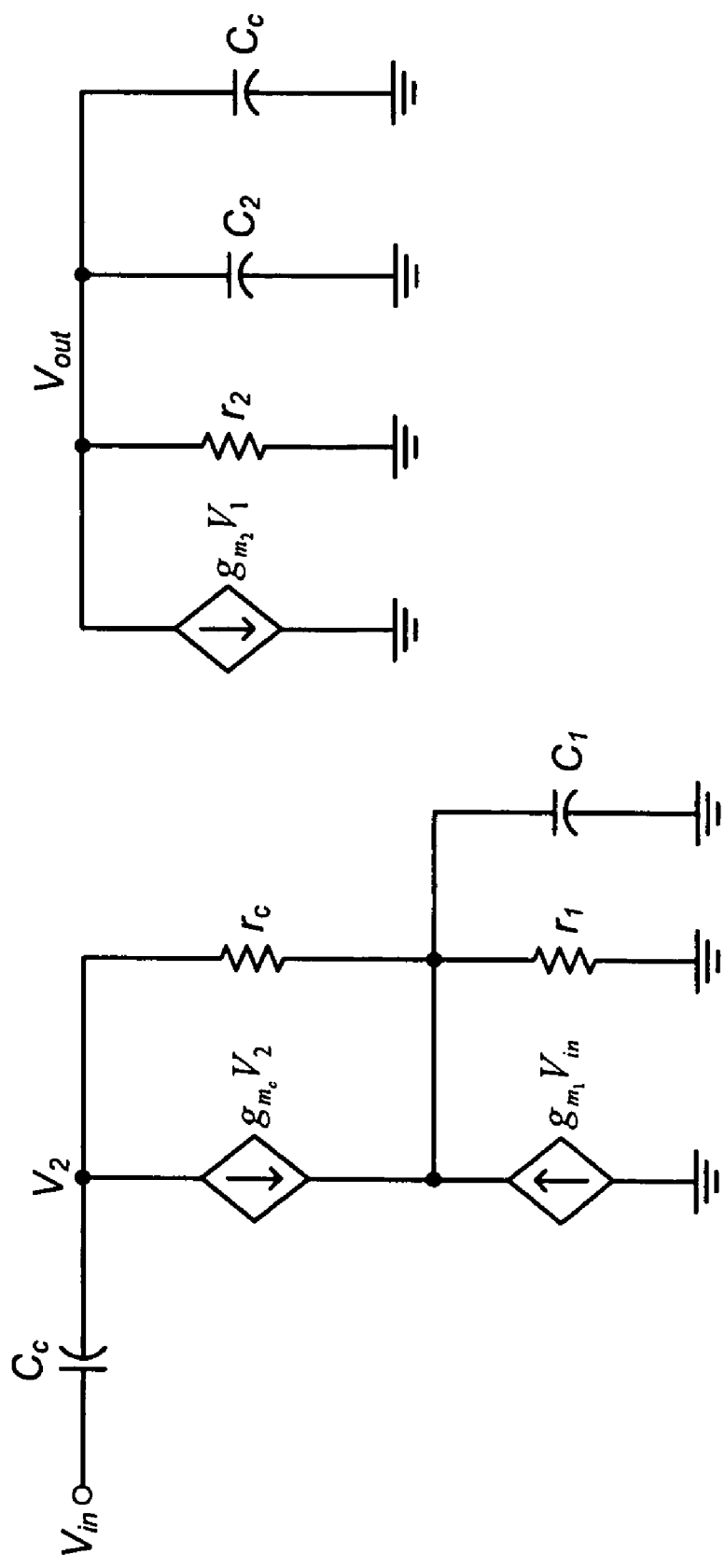
FIG. 14 is an equivalent circuit of the combined loop of the OTA in FIG. 13 including an open loop response.

Referring now to FIGS. 13 and 14, the circuit 70 includes a Combined Loop 134, which is a combination of the Main Loop 114 shown in FIG. 6 (identified by 134-1 in FIG. 13) and the Internal Loop 116 shown in FIG. 6 (identified by 134-2 in FIG. 13). In order to analyze the Combined Loop 134, a break 136 is made in the Combined Loop 134 as indicated in FIG. 13. FIG. 14 shows the equivalent circuit for the Combined Loop 134. As with FIG. 10, KVL and KCL are used to generate the node equations. Based on the equivalent circuit for the Combined Loop 134, the first node equation is $$(V_{in} - V_2)SC_c = g_{m_c}V_2 + \frac{V_2 - V_1}{r_c}.$$

The second node equation is $$(V_{in} - V_2)SC_c = -g_{m_1}V_{in} + \frac{V_1}{r_1} + V_1SC_1.$$

The third node equation is $$-g_{m_2}V_1 = \frac{V_{out}}{r_2} + V_{out}S(C_2 + C_c).$$

Based on the node equations, the transfer function for the Combined Loop 134 is determined. The transfer function is $$\frac{V_{out}}{V_{in}} = \frac{-g_{m_1}g_{m_2}r_1r_2\left(\frac{g_{m_c}+g_{m_1}}{g_{m_c}g_{m_1}}C_cS+1\right)}{\frac{r_1r_2C_1C_2C_c}{g_{m_c}} + \left(r_1r_2C_1C_2 + r_1r_2C_1C_c + \frac{(r_1+r_2)r_2C_2C_c}{g_{m_c}r_c}\right)S^2 + (r_1C_1 + r_2C_2 + r_2C_c)S + 1}.$$

Based on the transfer function, there are three poles and a single zero. The first pole is $$w_{p_1} = -\frac{1}{r_1C_1}.$$

This assumes that $r_1C_1 \gg r_2C_2, r_2C_c$. The second pole is $$w_{p_2} = -\frac{1}{r_2(C_2 + C_c)}.$$

The third pole is $$w_{p_3} = -\frac{g_{m_c}}{C_2 + C_c}.$$

The zero is $$\frac{1}{\left(\frac{1}{g_{m_1}} + \frac{1}{g_{m_c}}\right)C_c}.$$

The difference when compared to the Internal Loop 116 shown in FIG. 6 is that the zero $Z_1$ does not occur at a frequency equal to zero. The zero is located at the third node 126 and is quite high in frequency. Poles $P_1$ and $P_2$ are the same as with the Internal Loop 116 shown in FIG. 6. They are located at the first and second nodes 122 and 124, respectively, and are both high impedance nodes. Pole $P_3$ is located at the third node 126, which is a low impedance node. Therefore, pole $P_3$ is high in frequency.

Figure 15:
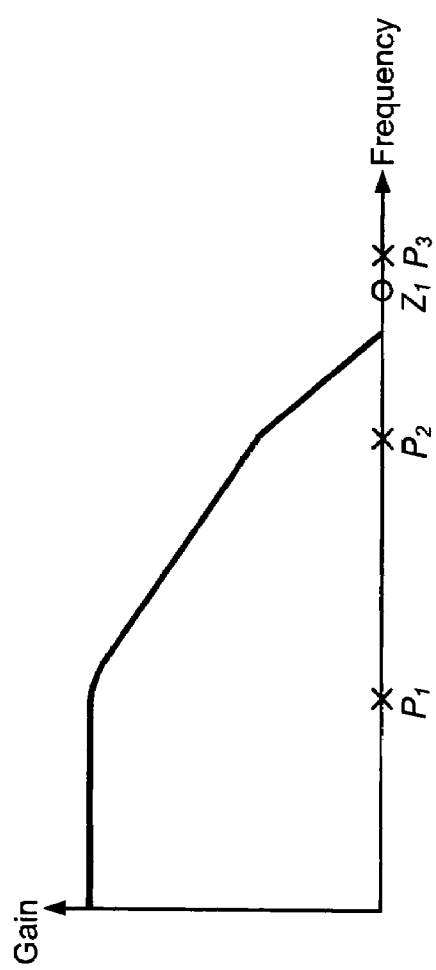
FIG. 15 illustrates the open loop response of the combined loop of the OTA in FIG. 13.
Figure 16:
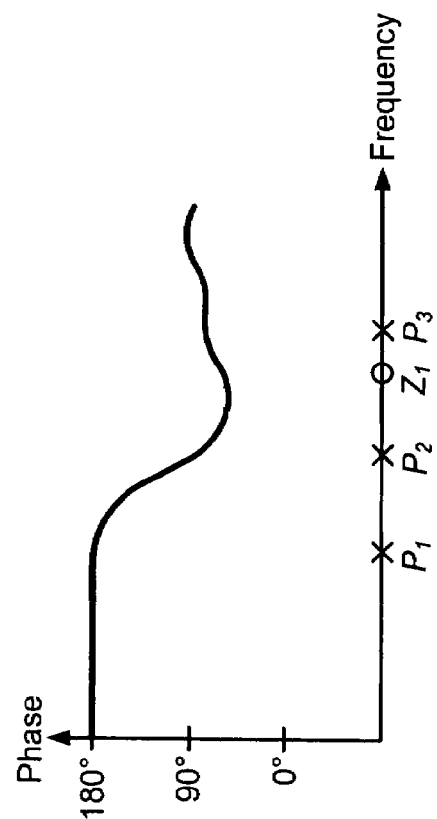
FIG. 16 is a graph illustrating the phase response corresponding to the open loop response of the combined loop of the OTA in FIG. 13.

Referring now to FIGS. 15 and 16, the zero $Z_1$ is located at a high frequency while the poles $P_1$ and $P_2$ are located at low frequencies and are close to each other. Therefore, the phase margin is reduced and the stability of the loop is low. As shown in FIG. 16, the gain is constant until the first pole is reached. The phase begins to lower and drops to less than 60 degrees, which is undesirable.

Therefore, while it is relatively easy to maintain stability in the Main Loop 114 shown in FIG. 6 and the Internal Loop 116 shown in FIG. 6, the Combined Loop 134 is potentially unstable. Since the Internal Loop 116 shown in FIG. 6 has a single zero located at zero frequency, it is easy to obtain a phase margin equal to 90 degrees. However, the Combined Loop 134 includes two poles at lower frequencies. The only zero is located at a high frequency value and is unable to cancel out the effect of a pole. It is potentially unstable. Therefore, it is important that all three loops of the Ahuja compensation architecture 72 are analyzed when designing a system 70. Otherwise, it is possible that the circuit 70 will appear to function properly during simulation but oscillate in actual silicon.

Figure 17:
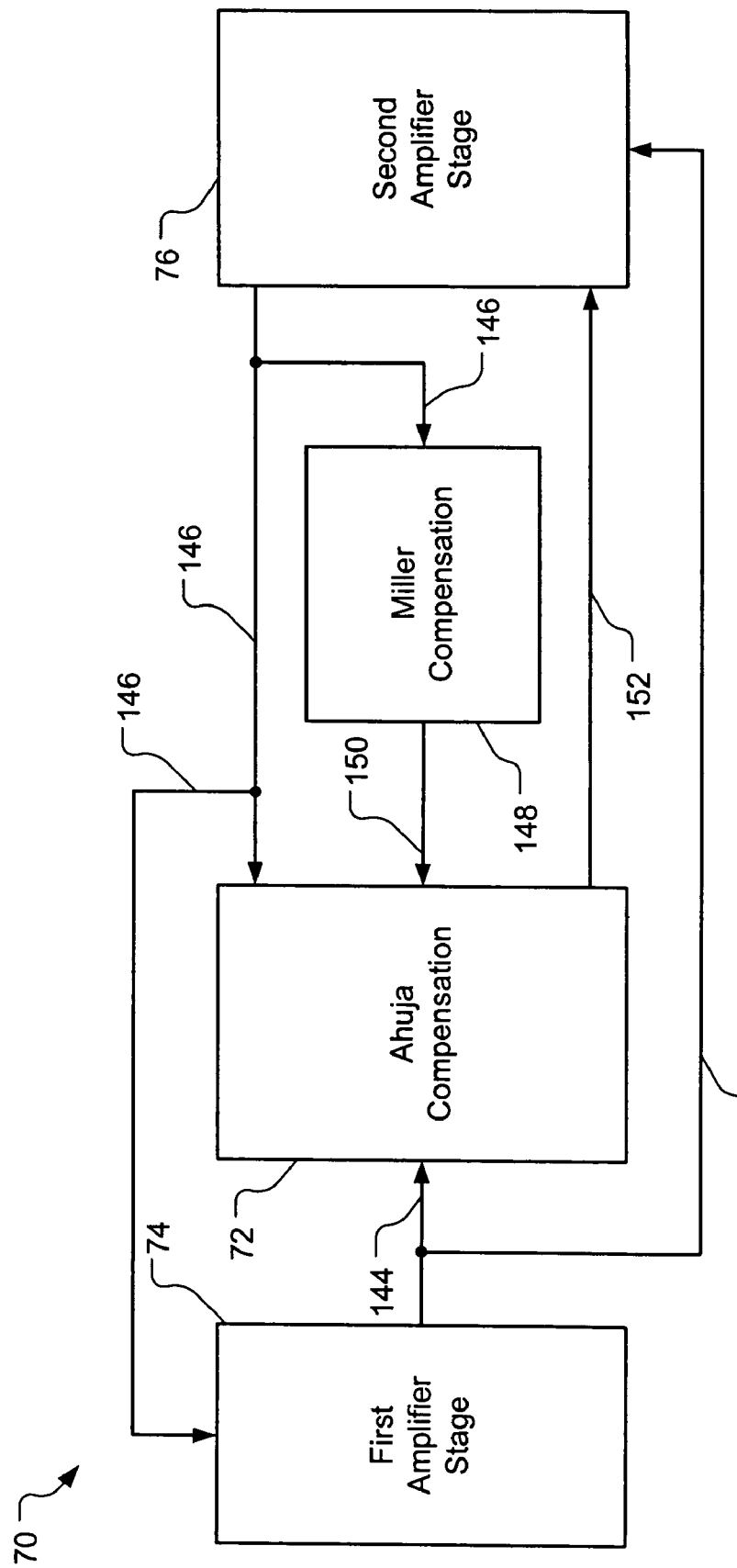
FIG. 17 is a functional block diagram of a frequency compensation architecture that includes an Ahuja compensation circuit as well as a Miller compensation circuit, according to the present invention.

Referring now to FIG. 17, in order to overcome the issues discussed above, the present invention discloses a frequency compensation architecture that includes both Ahuja compensation and Miller compensation. According to the present invention, the OTA 70 includes the first amplifier stage 74, which generates a first bias 144. The second amplifier stage 76 receives the first bias 144 and generates a feedback signal 146. The first amplifier stage 74 receives the feedback signal 146. A Miller compensation circuit 148 also receives the feedback signal 146 and generates a second bias 150. The Ahuja compensation circuit 72 receives the first and second biases 144 and 150, respectively, and the feedback signal 146 and generates a third bias 152. The second amplifier stage 76 receives the third bias 152. Therefore, the Miller compensation circuit 148 is integrated with the Ahuja compensation circuit 72 in order to make the circuit 70 stable.

Figure 18:
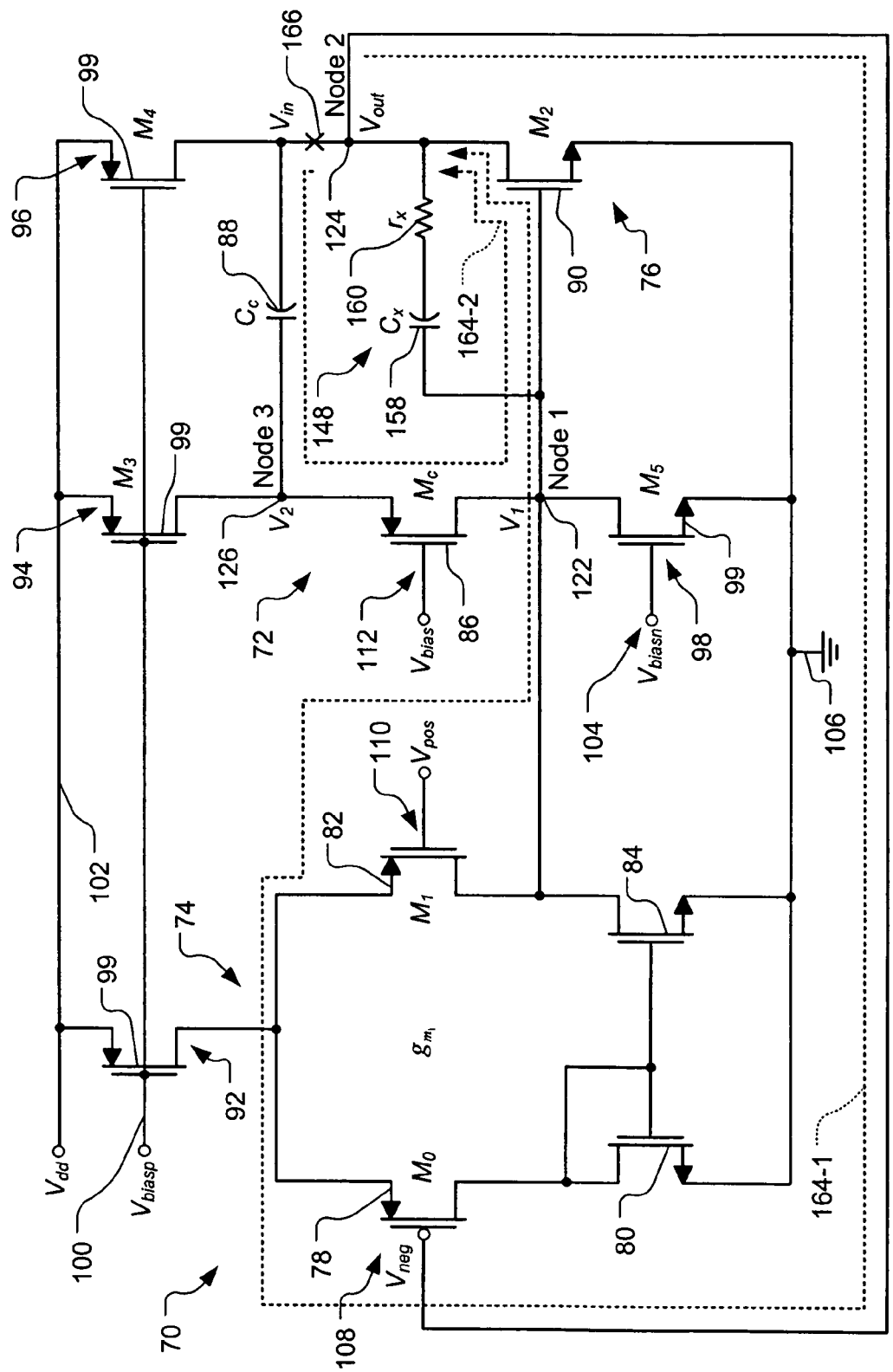
FIG. 18 is an electrical schematic of the combined loop including the additional Miller compensation architecture.

Referring now to FIG. 18, the Miller compensation circuit 148 includes a second capacitor 158 and a resistor 160. For example, the resistor 160 may be one of a fixed-value resistor, a nonlinear resistor, or a metal-oxide semiconductor (MOS) resistor, although other resistor types may be used.

A first end of the second capacitor 158 communicates with the drains of the third, fourth, and fifth transistors 82, 84, and 86, respectively, and the gate of the sixth transistor 90. A second end of the second capacitor 158 communicates with a first end of the resistor 160. A second end of the resistor 160 communicates with the drain of the sixth transistor 90, the second end of the first capacitor 88, and the gate of the first transistor 78.

Figure 19:
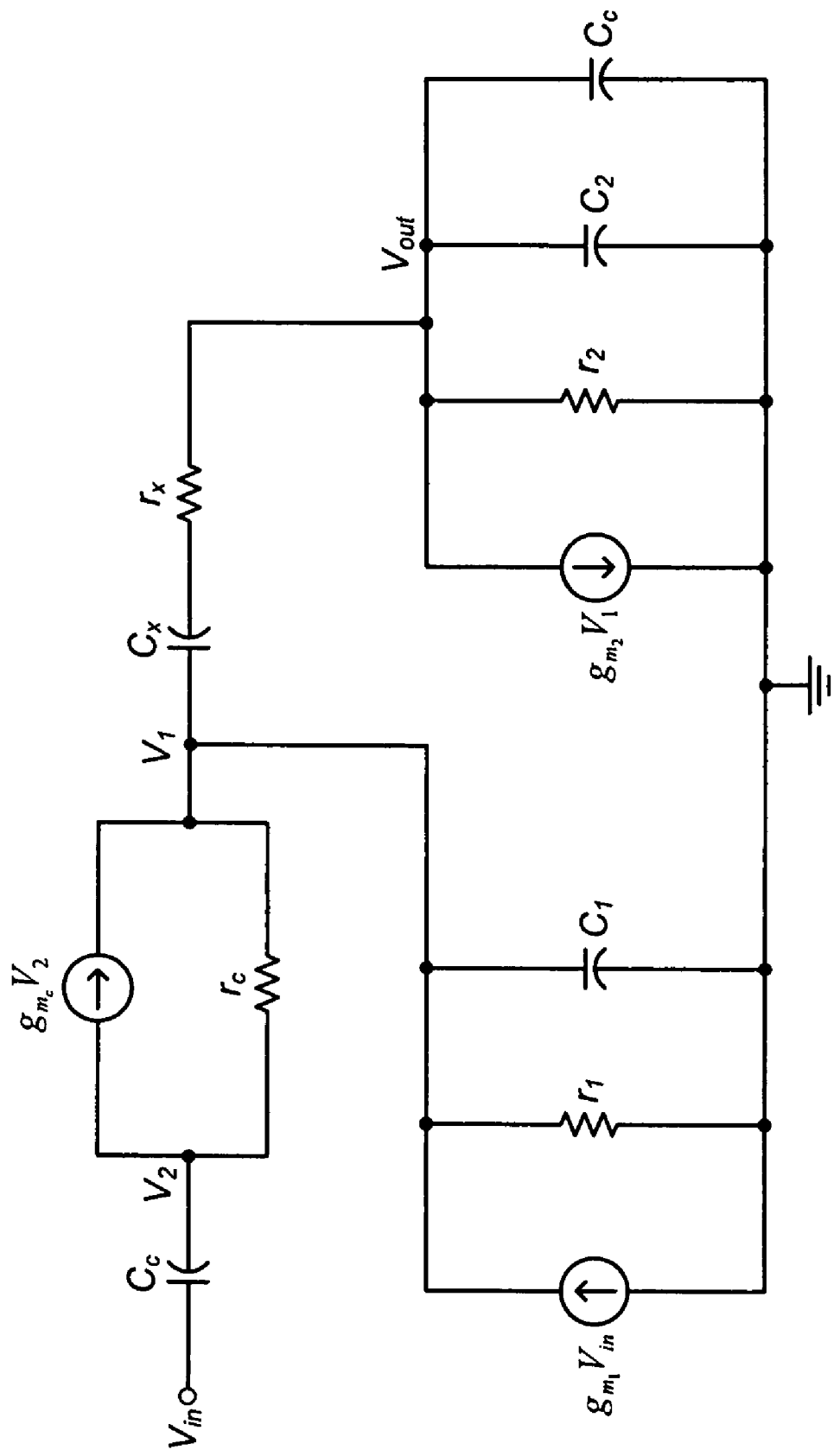
FIG. 19 is an equivalent circuit of the combined loop of the OTA in FIG. 18 including an open loop response.

In an exemplary embodiment, the second capacitor 158 is much smaller than the first capacitor 88. For example, the first capacitor 88 may have a value of 10 pF, and the second capacitor 158 may have a value of 1.5 pF, although other capacitor values may be used. The Combined Loop 134 shown in FIG. 13 is enhanced with the addition of the Miller compensation architecture 148. Therefore, a Combined Loop with Miller Compensation 164 is analyzed to determine the open loop response. The Combined Loop with Miller Compensation 164 includes a main loop component 164-1 and an internal loop component 164-2. In order to analyze the Combined Loop with Miller Compensation 164, a break 166 is made in the Combined Loop with Miller Compensation 164 as indicated in FIG. 18. FIG. 19 shows the equivalent circuit for the Combined Loop with Miller Compensation 164. As with FIG. 14, KVL and KCL are used to generate the node equations.

Based on the equivalent circuit for the Combined Loop with Miller Compensation 164, the first node equation is $$(V_{in} - V_2)C_c S = g_{m_c} V_2 + \frac{V_2 - V_1}{r_c}.$$

The second node equation is $$V_{in} g_{m_1} + (V_{in} - V_2)C_c S - \frac{(V_1 - V_{out})C_x S}{r_x C_x S + 1} = \frac{V_1}{r_1} + V_1 C_1 S.$$

The third node equation is $$\frac{(V_1 - V_{out})C_x S}{r_x C_x S + 1} = V_1 g_{m_2} + \frac{V_{out}}{r_2} + V_{out}(C_2 + C_c)S.$$

Based on the node equations, the transfer function for the Combined Loop with Miller Compensation 164 is determined. The transfer function is $$\frac{V_{out}}{V_{in}}(S) = -(g_{m_1} r_1)(g_{m_2} r_2)$$

$$\frac{\left(\left(r_x - \frac{1}{g_{m_2}}\right)C_x S + 1\right)\left(\left(r_x C_x + \left(\frac{1}{g_{m_c}} + \frac{1}{g_{m_1}}\right)C_c\right)S + 1\right)}{((r_2(C_2 + C_c) + g_{m_2} r_2 r_1 C_x)s + 1)\left(\left(\frac{1}{g_{m_2}}(C_2 + C_c) + \frac{1}{g_{m_c}}C_c\right)S + 1\right)}$$

$$\left(\frac{1}{\frac{g_{m_c}}{C_c} + \frac{g_{m_2}}{C_2 + C_c}} S + 1\right)(r_x C_1 S + 1)$$

Based on the transfer function, there are three poles and two zeros. The first pole is $$w_{p_1} = -\frac{1}{r_2(C_2 + C_c) + g_{m_2} r_2 r_1 C_x}.$$

The second pole is $$w_{p_2} = -\frac{1}{\frac{1}{g_{m_2}}(C_2 + C_c) + \frac{1}{g_{m_c}}C_c}.$$

The third pole is $$w_{p_3} = -\left(\frac{g_{m_c}}{C_c} + \frac{g_{m_c}}{C_2 + C_c}\right).$$

The fourth pole is $$w_{p_4} = -\frac{1}{r_x C_1}.$$

The first zero is $$w_{z_1} = -\frac{1}{r_x C_x + \left(\frac{1}{g_{m_c}} + \frac{1}{g_{m_1}}\right)C_c} \approx -\frac{1}{\left(\frac{1}{g_{m_c}} + \frac{1}{g_{m_1}}\right)C_c}.$$

The second zero is $$w_{z_2} = -\frac{1}{\left(r_x - \frac{1}{g_{m_2}}\right)C_x}.$$

Pole $P_1$ is the dominant pole. The frequency of the dominant pole $P_1$ is less than the frequency of the dominant pole $P_1$ in the open loop response of FIG. 15. Therefore, the addition of the Miller compensation architecture 148 makes the pole $P_1$ more dominant. Zero $Z_1$ is the same as with the Combined Loop 134 shown in FIG. 13. Pole $P_2$ was shifted to a higher frequency because of the pole-splitting function of Miller compensation, and its effect is cancelled by $Z_1$. Therefore, the frequency of the first pole is low, and the frequencies of the third and fourth poles and the second zero are high. Therefore, the system 70 is relatively stable.

Figure 20:
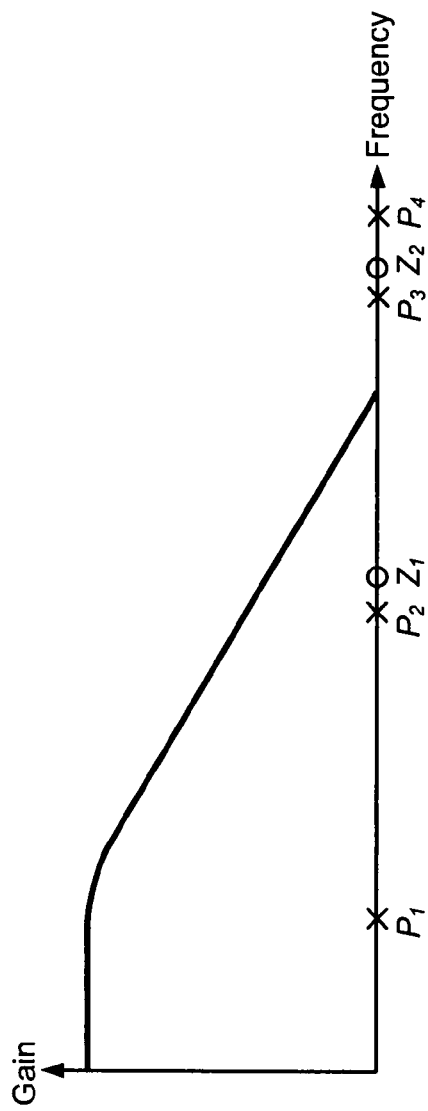
FIG. 20 illustrates the open loop response of the combined loop of the OTA in FIG. 18.
Figure 21:
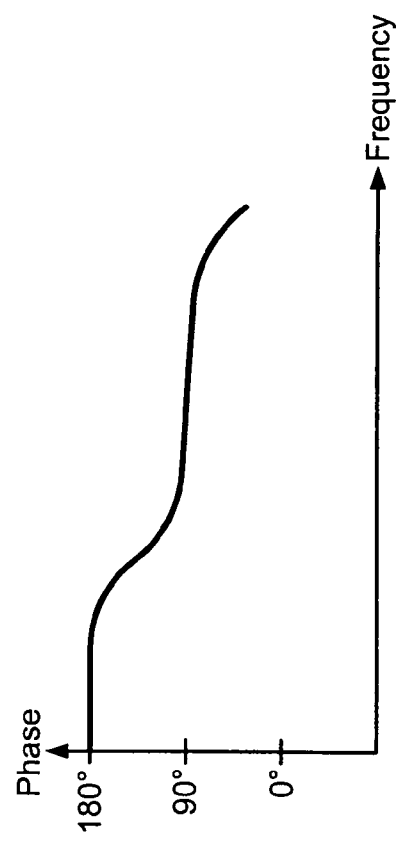
FIG. 21 is a graph illustrating the phase response corresponding to the open loop response of the combined loop of the OTA in FIG. 18.

Referring now to FIGS. 20 and 21, the phase drop illustrated in FIG. 21 is lower than the phase drop illustrated in FIG. 16. In the Combined Loop 134 shown in FIG. 13, there were two dominant poles close in frequency. By utilizing Miller compensation techniques, the poles are now split. Since the system 70 essentially functions as a single dominant pole system, it is relatively easy to obtain a phase margin equal to 90 degrees. Because $C_x$ is small in value compared with $C_c$, the UGB has decreased only a little bit and is still an acceptable value. In either case, the UGB is much higher in the Combined Loop with Miller Compensation 164 than in the Main Loop 114 shown in FIG. 6. This allows for satisfactory PSRR performance at high frequencies.

Those skilled in the art can now appreciate from the foregoing description that the broad teachings of the present invention can be implemented in a variety of forms. Therefore, while this invention has been described in connection with particular examples thereof, the true scope of the invention should not be so limited since other modifications will become apparent to the skilled practitioner upon a study of the drawings, specification, and the following claims.

What is claimed is:

1. An operational transconductance amplifier (OTA), comprising:
    a first amplifier circuit that generates a first bias;
    a second amplifier circuit that receives said first bias and that generates a feedback signal, wherein said first amplifier circuit receives said feedback signal;
    a Miller compensation circuit that receives said feedback signal and that generates a second bias; and
    an Ahuja compensation circuit that receives said first and second biases and said feedback signal and that generates a third bias,
    wherein said second amplifier circuit receives said third bias.

2. The OTA of claim 1 wherein said first amplifier includes a differential amplifier that includes first, second, third, and fourth transistors.

3. The OTA of claim 1 further comprising a current source that communicates with said first amplifier.

4. The OTA of claim 2 wherein said first, second, third, and fourth transistors are metal-oxide semiconductor field-effect transistors (MOSFETs).

5. The OTA of claim 1 wherein said Miller compensation circuit includes a capacitance that communicates with a resistance, which receives said feedback signal and wherein said capacitance generates said second bias.

6. The OTA of claim 5 wherein said resistance is one of a standard fixed-value resistor, a nonlinear resistor, and a metal-oxide semiconductor (MOS) resistor.

7. The OTA of claim 1 wherein said Ahuja compensation circuit includes a transistor that communicates with a capacitance and further comprising first and second current sources, wherein said first current source communicates with a first terminal of said transistor and said second current source communicates with a second terminal of said transistor.

8. The OTA of claim 7 wherein said capacitance receives said feedback signal, said transistor receives said first and second biases and said transistor generates said third bias.

9. The OTA of claim 1 further comprising a feedback loop having an open loop response with first and second poles that are located below a crossover frequency, wherein said Miller compensation circuit increases a frequency difference between said first and second poles.

10. The OTA of claim 9 wherein said feedback loop includes a first zero that is located below said crossover frequency and third and fourth poles and a second zero that are located above said crossover frequency.

11. The OTA of claim 1 further comprising a feedback loop having an open loop response with a pole and a zero that are located below a crossover frequency, wherein said Miller compensation circuit adjusts a frequency of said pole so that said zero cancels an effect of said pole on said open loop response.

12. An operational transconductance amplifier (OTA), comprising:
    first amplifying means for generating a first bias;
    second amplifying means for receiving said first bias and for generating a feedback signal, wherein said first amplifying means receives said feedback signal;
    first frequency compensation means for receiving said feedback signal and for generating a second bias; and
    second frequency compensation means for receiving said first and second biases and said feedback signal and for generating a third bias,
    wherein said second amplifying means receives said third bias.

13. The OTA of claim 12 wherein said first amplifying means includes a differential amplifier including first, second, third, and fourth transistors that communicate in a cascode configuration.

14. The OTA of claim 12 further comprising current means for providing current that communicates with said first amplifying means.

15. The OTA of claim 13 wherein said first, second, third, and fourth transistors are metal-oxide semiconductor field-effect transistors (MOSFETs).

16. The OTA of claim 12 wherein said first frequency compensating means includes capacitance means for providing a capacitance that communicates with resistance means for providing a resistance, wherein said resistance means receives said feedback signal, and wherein said capacitance means generates said second bias.

17. The OTA of claim 16 wherein said resistance means is one of a standard fixed-value resistor, a nonlinear resistor, and a metal-oxide semiconductor (MOS) resistor.

18. The OTA of claim 12 wherein said Ahuja compensation circuit includes a transistor that communicates with capacitance means for providing a capacitance and further comprising first current means for providing current and second current means for providing current, wherein said first current means communicates with a first terminal of said transistor and said second current means communicates with a second terminal of said transistor.

19. The OTA of claim 18 wherein said capacitance means receives said feedback signal, said transistor receives said first and second biases and said transistor generates said third bias.

20. The OTA of claim 12 further comprising feedback means for providing feedback having an open loop response with first and second poles that are located below a crossover frequency, wherein said first frequency compensating means increases a frequency difference between said first and second poles.

21. The OTA of claim 20 wherein said feedback means includes a first zero that is located below said crossover frequency and third and fourth poles and a second zero that are located above said crossover frequency.

22. The OTA of claim 12 further comprising feedback means for providing feedback having an open loop response with a pole and a zero that are located below a crossover frequency, wherein said first frequency compensating means adjusts a frequency of said pole so that said zero cancels an effect of said pole on said open loop response.

23. A method for operating an operational transconductance amplifier (OTA), comprising:
  generating a first bias;
  generating a feedback signal based on said first bias;
  generating a second bias based on said feedback signal using Miller frequency compensation; and
  generating a third bias based on said first and second biases and said feedback signal using Ahuja frequency compensation.

24. The method of claim 23 further comprising increasing a frequency difference between first and second poles that are located below a crossover frequency of an open loop response for the OTA using said Miller frequency compensation.

25. The method of claim 24 wherein said open loop response includes a first zero that is located below said crossover frequency and third and fourth poles and a second zero that are located above said crossover frequency.

26. The method of claim 23 further comprising adjusting a frequency of a pole that is located below a crossover frequency of an open loop response for the OTA using said Miller frequency compensation so that said pole cancels an effect of a zero that is located below said crossover frequency.

* * * * *

UNITED STATES PATENT AND TRADEMARK OFFICE
CERTIFICATE OF CORRECTION

PATENT NO. : 7,248,117 B1
APPLICATION NO. : 11/171026
DATED : July 24, 2007
INVENTOR(S) : Ying Tian Li et al.

It is certified that error appears in the above-identified patent and that said Letters Patent is hereby corrected as shown below:

Column 7, Line 25  Insert -- - -- after "="
Column 8, Line 65  Delete "Cc" and insert -- $C_c$ --
Column 9, Line 48  Before the first "+" and insert -- $S^3$ --

Signed and Sealed this

Thirteenth Day of November, 2007

JON W. DUDAS
*Director of the United States Patent and Trademark Office*